(12) United States Patent
Unnikrishnan et al.

(10) Patent No.: US 7,449,947 B2
(45) Date of Patent: Nov. 11, 2008

(54) REDUCTION OF VOLTAGE SPIKES IN SWITCHING HALF-BRIDGE STAGES

(75) Inventors: Sreenath Unnikrishnan, Allen, TX (US); Mike Tsecouras, Carrollton, TX (US); Jeff Berwick, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 11/516,093

(22) Filed: Sep. 6, 2006

(65) Prior Publication Data

US 2008/0055003 A1  Mar. 6, 2008

(51) Int. Cl.
*H03F 3/217* (2006.01)
(52) U.S. Cl. .................... 330/251; 330/307; 330/207 A
(58) Field of Classification Search ................. 330/251, 330/207 A, 307
See application file for complete search history.

(56) References Cited

U.S. PATENT DOCUMENTS

| 5,973,368 A * | 10/1999 | Pearce et al. ................. 257/368 |
| 6,424,208 B1 * | 7/2002 | Pinai .......................... 327/554 |
| 6,603,291 B2 * | 8/2003 | Wheeler et al. ............. 323/224 |
| 2007/0171591 A1 * | 7/2007 | Kaya et al. .................. 361/100 |

* cited by examiner

*Primary Examiner*—Patricia Nguyen
(74) *Attorney, Agent, or Firm*—Warren L. Franz; Wade J. Brady, III; Frederick J. Telecky, Jr.

(57) ABSTRACT

A path configuration for a power switch and driver can introduce independent parasitic inductance coupled to the power switch to slow a switching speed of the switch and reduce voltage spikes on the switch during switching events. The path for low side supply of the drive to the negative DC voltage reference is separate from the path of the power switch to the reference. The resulting reduction in voltage spikes due to the slowed switching time maintains performance in an audio amplifier without modifying a switch command signal to compensate for voltage spikes. The path configuration avoids reliance on specifying higher rated components that increase application costs.

9 Claims, 2 Drawing Sheets

REDUCTION OF VOLTAGE SPIKES IN SWITCHING HALF-BRIDGE STAGES

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

1. Field of the Invention

The present relates generally to performance improvements in switching circuits and relates more particularly to a reduction in voltage spike magnitude appearing across power switches in a switched power application.

2. Description of Related Art

Class D audio amplifiers have a number of advantages including high efficiency and low cost. A portion of a power stage for an amplifier is illustrated in FIG. 1 as circuit 10. Circuit 10 includes a switching half bridge 12 composed of MOSFETs 13 and 14. In the case of an audio amplifier application, switches 13 and 14 are switched in accordance with a PWM signal related to an input audio signal. Where circuit 10 is used in a high power application such as for a loud speaker, a supply voltage maximum is limited in some cases by a voltage rating of power MOSFETs 13 and 14. For example, the voltage rating of power MOSFETs 13 and 14 may be determined by the values of BVdss and BVii, which are the drain-to-source breakdown voltages of the FET in an on-state and off-state, respectively. The value of BVdss/BVii specifies power MOSFET characteristics for a given power switching application. In the case of circuit 10, switching power MOSFETs 13, 14 are exposed to spike voltages during switching events. The magnitude of the spike voltages depends upon the speed at which current is switched between MOSFETs 13, 14, such as when low side MOSFETs 14 turns off and high side MOSFET 13 turns on, for example. If the switching events occur very rapidly, the switched current can produce high voltage spikes that can exceed the ratings of circuit 10, and damage or destroy MOSFETs 13, 14.

Switching speed for MOSFETs 13, 14 can be controlled by the drive current applied to the gate of MOSFETs 13, 14 by drivers 15, 16 respectively. The drive signals provided by drivers 15, 16 can be applied to the gates of MOSFETs 13, 14 according to a given profile, or with a particular magnitude limit to achieve any given switching characteristic or speed.

In applications that use power switching half bridge configurations, such as DC-DC converters, gate drivers can be used to slow switching speeds of the power switches to avoid high voltage spikes with little or no penalty. In DC-DC converter applications, switching speed is not as critical to the performance of the converter. However, in audio applications with a rapidly changing continuous input, slowing switching speed can have a negative impact on application performance.

If switching speed is reduced, for example, in an audio application, the resulting impact on performance tends to increase the total harmonic distortion (THD) or increase shoot through currents by limiting dead time response. The increase in THD reduces performance with respect to the output of the audio amplifier in terms of sound quality. The increase in shoot through currents tends to impact device longevity and performance because of the high currents experienced by the switching devices. In addition, increases in shoot through currents tend to increase power dissipation, leading to reduced efficiency of the audio amplifier when placed in an idle state.

One solution to the above-described challenges is to specify power switches with higher ratings, which can absorb higher spike voltages without significant impact on the switching device. However, the use of more highly rated switching devices can significantly increase the cost of the audio amplifier solution.

Accordingly, it would be desirable to provide a system and method for handling high voltage spikes in an audio amplifier power stage without modifying switching times of the power stage switches.

BRIEF SUMMARY OF THE INVENTION

In accordance with the present invention, there is provided a system and method for configuring a switching half bridge in an amplifier to take advantage of component characteristics to slow a switching speed of a power switch to avoid high voltage spikes. According to an exemplary embodiment of the present invention, internal components such as parasitic bond wire inductances are arranged in conjunction with power switch driver power paths to impact a gate voltage to slow a switching speed of a power switch. The bond wire paths for a half bridge power switch are arranged to obtain separate component values for a gate driver ground path and a gate-to-source path for a MOSFET switch, for example. The resulting component value applied to the gate-to-source path contributes to slowing operation of the power switch to avoid high voltage spikes. The modification of circuit paths to take advantage of the impact of internal components achieves a slower switching speed for the power switch, without modifying a gate drive signal. That is, the gate drive signal need not be slowed or otherwise modified to compensate for high voltage spike events, when the gate driver and switch paths are arranged in accordance with the present invention.

According to one aspect, one or more of the switches in a switching half bridge has signal paths that are arranged in accordance with the present invention. Although the present invention may typically have a greater impact on the performance of the low side switch, the high side switch paths can also be configured to take advantage of internal component values to achieve the advantages of the present invention.

According to another aspect of the present invention, the internal components provided on separate pathways can be any type of component, including passive components such as resistors, capacitors or conductors, and active components, such as switches or diodes. According to another aspect of the present invention, the switching half bridge amplifier is included in an audio amplifier that operates in an open loop.

In accordance with an embodiment of the present invention, the effective gate voltage Vgs of a power FET is increased to effectively slow the switching speed of the power FET. Alternately, or in addition, the present invention effectively weakens a gate drive of a power FET to slow switching speed, without modifying a speed of a switch command signal.

Other features and advantages of the present invention will become clear from the following Detailed Description read in conjunction with the accompanying drawings.

BRIEF DESCRIPTION OF THE SEVERAL VIEWS OF THE DRAWINGS

The invention is described below in greater detail, to be read in conjunction with the accompanying drawings, in which.

DETAILED DESCRIPTION OF THE INVENTION

Figure 1:
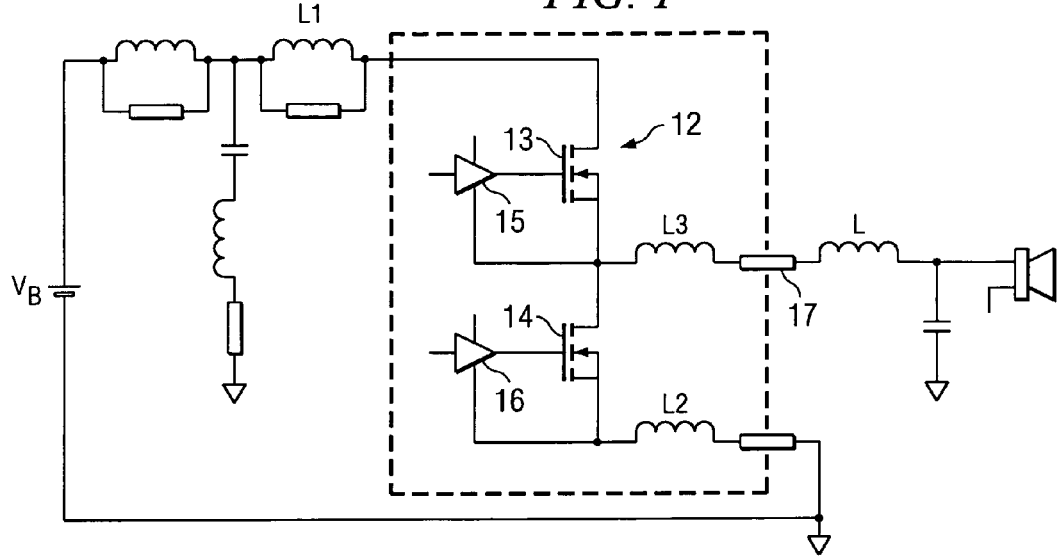
FIG. 1 is a circuit block diagram of a conventional audio amplifier path arrangement.

Referring to FIG. 1, a typical class D audio amplifier is illustrated generally as circuit 10. A number of inherent characteristics of circuit 10 are modeled as parasitic impedances, including an inductances L2-L3 related to bond wire inductance, and inductor L1 related to traces on a printed circuit board (PCB). Switches 13, 14, illustrated as FETs in circuit 10 can be exposed to high voltage spikes during switching events, especially when switches 13, 14 are switched rapidly. For example, in the state where switch 13 is not conducting and switch 14 is conducting, current can flow from output inductor L through output pin 17 and through switch 14 to ground. In this state, when switch 14 turns off, the current supplied by inductor L begins to flow through inductor L3 and the body diode of switch 13, and is input into inductor L1. Inductor L1 is modeled as a parasitic inductance, which is maintained at as low a value as possible due to its impact on the generation of high voltage spikes. That is, as current from inductor L begins to flow through the body diode of switch 13, inductor L1 impedes the current flow, contributing to a voltage rise across power switch 14.

Although the value of inductor L1 is maintained at a very small value, there is a significant increase in voltage at output pin 17, determined by the positive di/dt across parasitic inductance L1. Because of the inherent characteristics of parasitic inductance L1, a high voltage spike will typically be observed at output pin 17, or across the output of power switch 14 when power switch 14 turns off while conducting a current from output inductor L. These observations also apply to power switch 13, which can experience high voltage spikes upon shutoff.

Circuit 10 illustrates driver 16, which applies the gate drive signal to power switch 14, as having a low side power supply directly coupled to the source of power switch 14. The negative supply of gate driver 16 is typically connected to a bond pad, to which the source of power switch 14 is also connected. According to this configuration, the switching speed of power switch 14 is completely controlled by the output of gate driver 16. The di/dt value of power switch 14 is thus determined by gate driver 16 with respect to gate voltage Vgs, or a magnitude of the output of gate driver 16, for example. In this configuration, high voltage spikes across switch 14 are limited or reduced by modifying the input signal to gate drive 16 to slow the switching speed of power switch 14.

This approach has a negative impact on amplifier performance due to distortion of the signal generated from the continuous audio signal input. Alternatively, power switch 14 may be selected to have a greater rating or spike voltage specification to meet the challenge of managing high voltage spikes. For example, power switch 14 may be selected so that the spike voltage plus the DC input voltage magnitude is within the ABS Max of power switch 14. This alternative can greatly increase application costs, due to the higher component cost associate with the higher component ratings.

Figure 2:
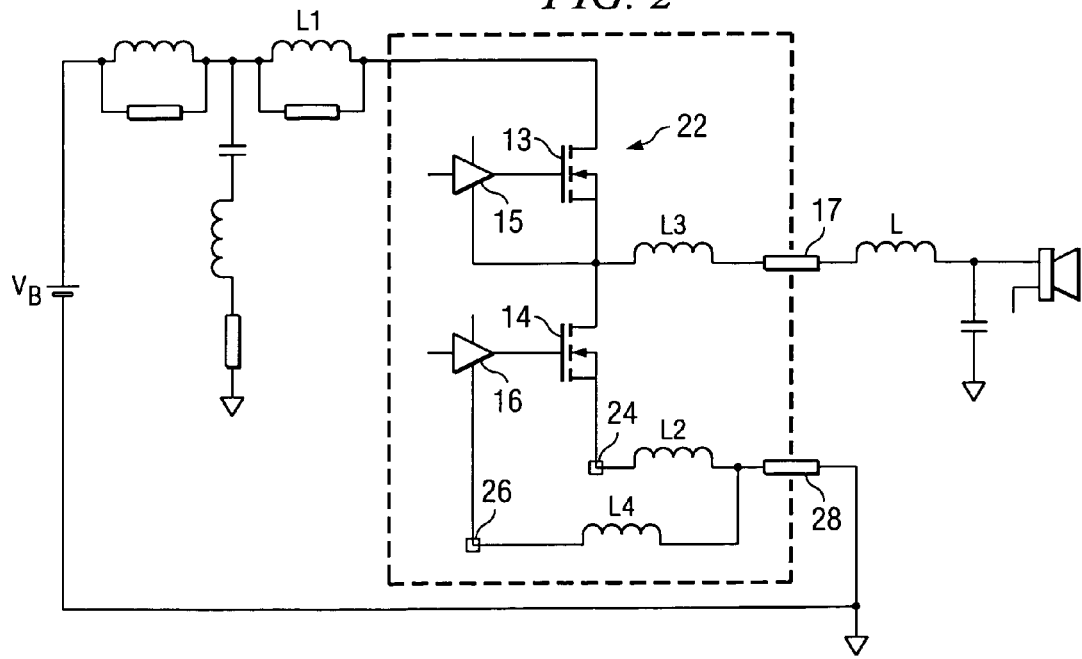
FIG. 2 is a circuit block diagram of an embodiment of an audio amplifier in accordance with the present invention.

Referring now to FIG. 2, an audio amplifier in accordance with the present invention is illustrated generally as circuit 20. Circuit 20 is substantially similar to circuit 10 in FIG. 1, and has a different path arrangement in a switching half bridge 22 in accordance with the present invention. Instead of connecting a low side power supply of driver 16 to the source of power switch 14 at bond pad 24, a separate bond pad 26 and connection path are provided to low side reference voltage pin 28. By providing the separate path and bond pad 26, the characteristics of parasitic inductance L2 are permitted to directly impact the switching characteristics of power switch 14. Inductance L2 is thus isolated and used to influence a switching speed of power switch 14. The presence of inductor L2 at the source connection of power switch 14 tends to increase the effective voltage Vgs for power switch 14. The effective increase in gate voltage Vgs provides a reduced rate of turn off for switch 14, thereby reducing a voltage spike magnitude observed during turn off.

Accordingly, the inherent characteristics of inductor L2 are employed to contribute to slowing a switching speed of power switch 14, without any signal changes derived from gate drive 16 that would otherwise have a negative impact on amplifier performance. Another way to view the impact of inductor L2 on power switch 14 is to recognize that inductor L2 weakens the gate drive applied to power switch 14, so that switching speed is reduced.

The operation and advantages of the invention are illustrated in the context of the above example, where the half bridge state is set so that high side switch 13 is off and low side switch 14 is on. In this state, power switch 14 is conducting current supplied from inductor L. As switch 14 is turned off, the voltage response is significantly different from that described above with respect to circuit 10. In circuit 20, the normal gate drive signal from gate driver 16 begins to turn off power switch 14, and current begins to flow from inductor L through the body diode of power switch 13 to inductor L1. Because the low side power supply of gate driver 16 is decoupled from the source of power switch 14, parasitic inductance L2 can now separately impact gate voltage Vgs during turn off. Turn off of power switch 14 is achieved by gate driver 16 drawing current from the gate of power switch 14. Current drawn from the gate of power switch 14 can flow from the source of power switch 14, so that a current path exists from reference pin 28, through parasitic inductance L2 and from the source to the gate of power switch 14. This current path is separate from the current path provided from reference pin 28 through a parasitic inductance L4 and bond pad 26 to the low side power supply of gate driver 16. Accordingly, the application of a turn off signal to gate driver 16 sinks current from a gate of power switch 14 and parasitic inductance L2. The addition of parasitic inductance L2 in the current path weakens the gate drive current sink, so that power switch 14 takes longer to turn off. Alternately, the effective turn off gate voltage Vgs is increased by the presence of inductor L2 in the current path.

The path configuration illustrated in circuit 20 provides a slower turn off time for power switch 14 without impacting the signal speed of the command applied to gate driver 16. The slowed switch response decreases the voltage spike observed by power switch 14 due to the reduction of di/dt for power switch 14. Accordingly, parasitic inductance L2 acts as a negative feedback mechanism to reduce the voltage spike on power switch 14 during turn off. The solution provided by circuit 20 is achieved without the need to specify higher rated components, thereby maintaining or reducing a cost level for the amplifier while maintaining performance characteristics.

The present invention illustrated in circuit 20 is also applicable to high side power switch 13 when a PMOS device is used as the high side switch. Spike voltages across the supply of high side gate driver 15 can cause improper operation of switch 13. The present invention improves the reliability of circuit 10 by reducing the voltage spikes that occur between the drain and source of high side power switch 13. One or both of power switches 13, 14 can employ the construction of the present invention to realize the benefits discussed above.

Figure 3:
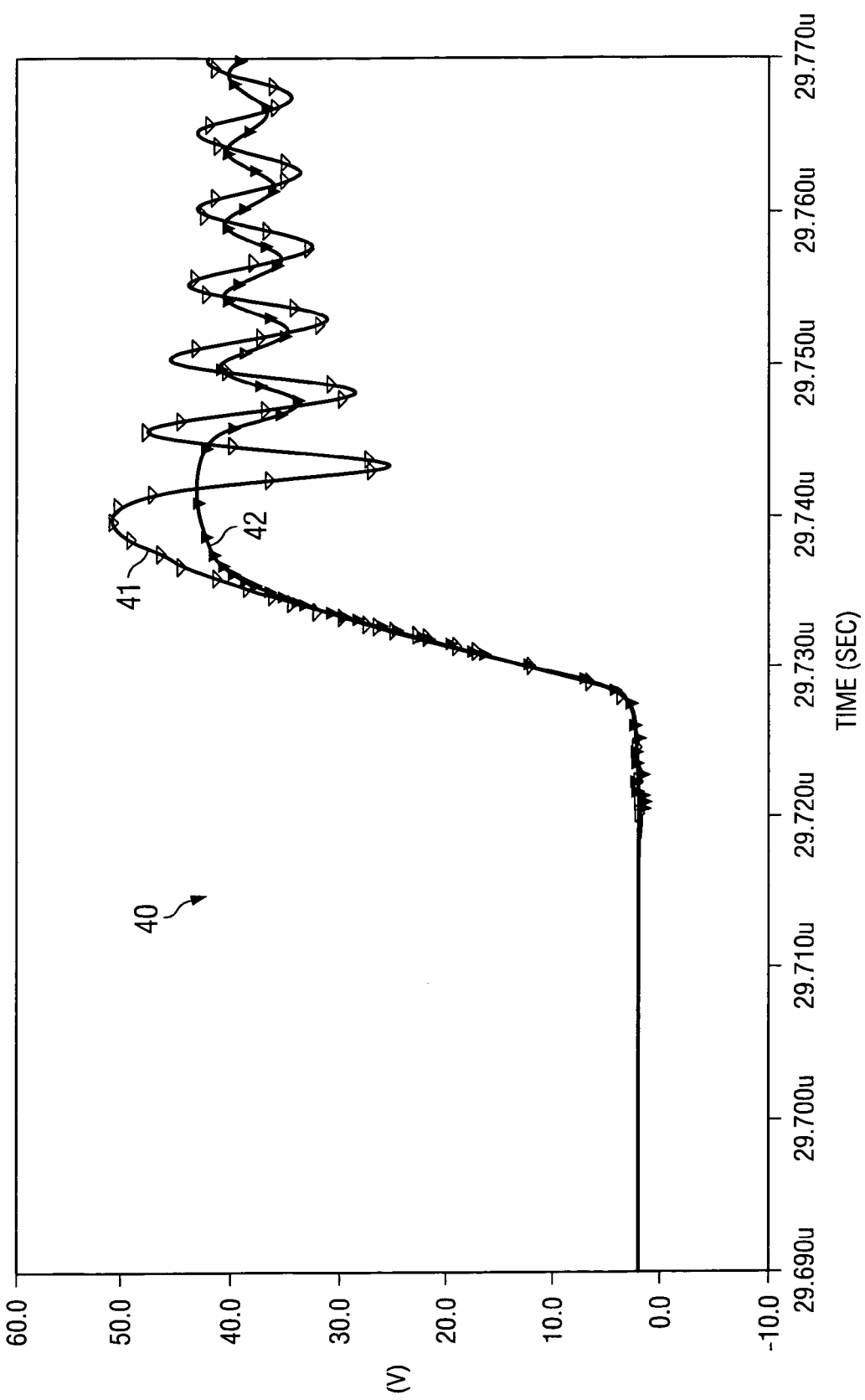
FIG. 3 is a set of graphs illustrating performance improvements in accordance with the present invention.

FIG. 3 shows a graph 40 that illustrates a performance improvement in the response of an audio amplifier in accordance with the present invention. Waveforms 41 and 42 represent simulated voltages at output pin 17 in circuits 10 and 20, respectively. As waveforms 41 and 42 indicate, a marked improvement in performance can be obtained in accordance with the present invention.

While power switches 13, 14 are illustrated as N channel devices, the invention is also applicable to CMOS configuration that include NMOS and PMOS switches, or PMOS configurations. In the case of CMOS or PMOS realizations, other advantages may be realized in accordance with the present invention due to the reduced circuitry used to switch the PMOS switches.

The present invention is applicable to switching configurations other than the class D amplifier described above. In instances where a power switch, such as a power MOSFET, is potentially exposed to high spike voltages, the present invention may be used to enhance the performance of the circuit. The present invention is also applicable to systems with a wide range of power ratings, as well as closed loop systems. Although circuit 20 is illustrated as a DC circuit with a common ground reference, the DC voltage can be supplied as positive and negative rails without departing from the scope of the invention. It should also be clear that the circuits according to the present invention are typically realized through integrated circuits (ICs).

Although the present invention has been described in relation to particular embodiments thereof, other variations and modifications and other uses will become apparent to those skilled in the art from the description. It is intended therefore, that the present invention not be limited not by the specific disclosure herein, but to be given the full scope indicated by the appended claims.

What is claimed is:

1. A circuit configuration for a power switch driver and a power switch in an IC, comprising:
    a low side power supply connection for the power switch driver;
    an IC pin for providing an external electrical connection to one side of the switch;
    the low side power supply connection connected to the pin connection; and
    separate paths for the connections between the low side power supply connection to the pin and between the one side of the switch to the pin, the separate paths including corresponding separate bond pads and bond wires, whereby the bondwires of the separate paths have parasitic inductances that impact the switching time of the power switch.

2. An audio amplifier comprising the circuit configuration according to claim 1.

3. A switching half bridge circuit composed of two switches, one or more of the switches comprising the circuit configuration according to claim 1.

4. The circuit configuration according to claim 1, wherein the power switch is a MOS-gated switch.

5. A method for reducing voltage spikes on a power switch, comprising;
    arranging a separate path for a connection to one side of the power switch in relation to a power supply for a switch driver; and
    decreasing a switching time of the power switch based on inherent characteristics of the separate path, whereby the voltage spike magnitude is reduced.

6. The method according to claim 4, further comprising forming a parasitic inductor in the separate path.

7. A class D audio amplifier power stage IC, comprising:
    a power switch for switching power in the power stage;
    a power switch driver for driving the power switch in accordance with a switching command applied to the driver and having a low side power supply connection;
    separate paths for each of the low side power supply connection and one side of the power switch to an external IC pin;
    the characteristics of the path to the one side of the power switch contributing to decreasing a switching speed of the power switch to reduce a magnitude of a voltage spike during switching events.

8. The IC according to claim 7, further comprising:
    another power switch for switching power in conjunction with the one power switch; and
    another power switch driver for driving the another power switch in accordance with another switching command applied to the another driver, and having a another low side power supply connection.

9. The IC according to claim 8, further comprising separate paths for each of the another low side power supply connection and one side of the another power switch to an external IC pin.

* * * * *